(12) United States Patent
Leomant et al.

(10) Patent No.: US 11,908,904 B2
(45) Date of Patent: Feb. 20, 2024

(54) PLANAR GATE SEMICONDUCTOR DEVICE WITH OXYGEN-DOPED SI-LAYERS

(71) Applicant: Infineon Technologies Austria AG, Villach (AT)

(72) Inventors: Sylvain Leomant, Poertschach am Woerthersee (AT); Thomas Feil, Villach (AT); Yulia Polak, Arnoldstein (AT); Maximilian Roesch, St. Magdalen (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/400,575

(22) Filed: Aug. 12, 2021

(65) Prior Publication Data

US 2023/0047420 A1 Feb. 16, 2023

(51) Int. Cl.
*H01L 27/088* (2006.01)
*H01L 29/78* (2006.01)
*H01L 29/40* (2006.01)

(52) U.S. Cl.
CPC .......... *H01L 29/407* (2013.01); *H01L 27/088* (2013.01); *H01L 29/7802* (2013.01)

(58) Field of Classification Search
CPC .. H01L 29/407; H01L 27/088; H01L 29/7802
See application file for complete search history.

(56) References Cited

U.S. PATENT DOCUMENTS 6,404,007 B1 6/2002 Mo et al.
7,858,478 B2 12/2010 Hirler
(Continued)

FOREIGN PATENT DOCUMENTS

DE 102006002903 A1 8/2007
DE 102007044414 A1 3/2009
(Continued)

OTHER PUBLICATIONS

Datta, Suman, "Mitigation of Intrinsic Vt Variation using Oxygen Inserted (OI) Silicon Channel", University of Notre Dame, IEEE IEDM conference in San Francisco, CA, USA, Dec. 2017, accessed online at http://blog.atomera.com/wp-content/uploads/2017/12/2017-IEDM-Seminar-Suman-20171204.pdf on Aug. 8, 2018, pp. 1-20.
(Continued)

*Primary Examiner* — Eugene Lee
(74) *Attorney, Agent, or Firm* — Murphy, Bilak & Homiller, PLLC

(57) ABSTRACT

A semiconductor device includes: a semiconductor substrate having opposing first and second main surfaces; a plurality of transistor cells each including a source region, a drift zone, a body region separating the source region from the drift zone, a field plate trench extending into the drift zone and including a field plate, and a planar gate on the first main surface and configured to control current through a channel of the body region; a drain region at the second main surface; and a diffusion barrier structure including alternating layers of Si and oxygen-doped Si and a Si capping layer on the alternating layers of Si and oxygen-doped Si. The diffusion barrier structure may be interposed between body regions of adjacent transistor cells and/or extend along the channel of each transistor cell and/or vertically extend in the semiconductor substrate between adjacent field plate trenches.

22 Claims, 3 Drawing Sheets

(56) References Cited

U.S. PATENT DOCUMENTS

| | | |
|---|---|---|
| 8,067,800 B2 | 11/2011 | Hsieh |
| 10,510,836 B1 | 12/2019 | Haase et al. |
| 10,573,742 B1 | 2/2020 | Feil et al. |
| 10,580,888 B1 | 3/2020 | Blank et al. |
| 10,741,638 B2 | 8/2020 | Poelzl et al. |
| 2004/0031987 A1 | 2/2004 | Henninger et al. |
| 2004/0166636 A1 | 8/2004 | Darwish |
| 2005/0167742 A1 | 8/2005 | Challa et al. |
| 2007/0249142 A1 | 10/2007 | Hisanaga |
| 2012/0061754 A1 | 3/2012 | Hsieh |
| 2012/0064684 A1 | 3/2012 | Hsieh |
| 2012/0074489 A1 | 3/2012 | Hsieh |
| 2012/0187477 A1 | 7/2012 | Hsieh |
| 2012/0280293 A1 | 11/2012 | Pan |
| 2013/0168760 A1 | 7/2013 | Hsieh |
| 2013/0313632 A1 | 11/2013 | Schulze et al. |
| 2015/0270378 A1 | 9/2015 | Konishi et al. |
| 2016/0300908 A1 | 10/2016 | Heo et al. |
| 2017/0263720 A1 | 9/2017 | Hirler et al. |
| 2020/0052066 A1 | 2/2020 | Poelzl et al. |
| 2020/0152733 A1* | 5/2020 | Poelzl .................. H01L 29/0634 |
| 2020/0350401 A1* | 11/2020 | Poelzl .................. H01L 29/7813 |
| 2021/0005715 A1* | 1/2021 | Feil .................... H01L 29/1045 |

FOREIGN PATENT DOCUMENTS

| | | | |
|---|---|---|---|
| EP | 19184395.2 | * | 7/2019 |
| WO | 2009079465 A1 | | 6/2009 |

OTHER PUBLICATIONS

Havanur, Sanjay, et al., "Power MOSFET Basics Understanding Superjunction Technology", Vishay Siliconix, Device Application Note AN849, accessed online at https://www.vishay.com/docs/66864/an849.pdf on Jul. 2, 2019, pp. 1-5.

Shao, Lin, et al., "Boron diffusion in silicon: the anomalies and control by point defect engineering", Reports: A Review Journal, Materials Science and Engineering R 42, Aug. 11, 2003, pp. 65-114.

Takeuchi, Hideki, et al., "Punch-Through Stop Doping Profile Control via Interstitial Trapping by Oxygen-Insertion Silicon Channel", 2017 IEEE Electron Devices Technology and Manufacturing Conference (EDTM), Feb. 28-Mar. 2, 2017, pp. 1-6.

Xu, Nuo, et al., "Extension of Planar Bulk n-Channel MOSFET Scaling With Oxygen Insertion Technology", IEEE Transactions on Electron Devices, vol. 61, No. 9, Sep. 2014, pp. 3345-3349.

Xu, N., et al., "MOSFET Performance and Scalability Enhancement by Insertion of Oxygen Layers", 2012 International Electron Devices Meeting, San Francisco, CA, USA, Dec. 2012, pp. 1-4.

* cited by examiner

PLANAR GATE SEMICONDUCTOR DEVICE WITH OXYGEN-DOPED SI-LAYERS

BACKGROUND

State-of-the-art power MOSFETs (metal-oxide-semiconductor field-effect transistors) typically have a vertical structure combining two electrodes, one for the gate and one for a field plate which is usually grounded, within the same trench. The use of a grounded field plate enables a two-dimensional depletion region while shielding the gate dielectric from drain potential which reduces FOM (figure of merit), where FOM is the product of the on-state resistance (Rdson) and the gate charges.

Quasi-planar power MOSFET concepts which combine a grounded vertical field plate electrode for charge compensation and a planar gate potentially offer better control of channel length and the gate-to-drain overlap compared to purely vertical channel structures, while facilitating the integration of new functionalities such as both drain and source potentials being accessible at the front side of a semiconductor wafer. However, the quasi-planar approach suffers from a JFET (junction FET) effect between adjacent body regions which constricts the current in the on-state.

Hence, a quasi-planar power MOSFET device that does not suffer from the JFET effect described above is desirable.

SUMMARY

According to an embodiment of a semiconductor device, the semiconductor device comprises: a semiconductor substrate having a first main surface and a second main surface opposite the first main surface; a plurality of transistor cells, each transistor cell comprising a source region of a first conductivity type, a drift zone of the first conductivity type, a body region of a second conductivity type separating the source region from the drift zone, a field plate trench extending into the drift zone and including a field plate, and a planar gate on the first main surface and configured to control current through a channel of the body region; a drain region of the first conductivity type at the second main surface; and a diffusion barrier structure interposed between body regions of adjacent transistor cells, the diffusion barrier structure comprising alternating layers of Si and oxygen-doped Si and a Si capping layer on the alternating layers of Si and oxygen-doped Si.

According to another embodiment of a semiconductor device, the semiconductor device comprises: a semiconductor substrate having a first main surface and a second main surface opposite the first main surface; a plurality of transistor cells, each transistor cell comprising a source region of a first conductivity type, a drift zone of the first conductivity type, a body region of a second conductivity type separating the source region from the drift zone, a field plate trench extending into the drift zone and including a field plate, and a planar gate on the first main surface and configured to control current through a channel of the body region; a drain region of the first conductivity type at the second main surface; and a diffusion barrier structure extending along the channel of each transistor cell, the diffusion barrier structure comprising alternating layers of Si and oxygen-doped Si and a Si capping layer on the alternating layers of Si and oxygen-doped Si.

According to another embodiment of a semiconductor device, the semiconductor device comprises: a semiconductor substrate having a first main surface and a second main surface opposite the first main surface; a plurality of transistor cells, each transistor cell comprising a source region of a first conductivity type, a drift zone of the first conductivity type, a body region of a second conductivity type separating the source region from the drift zone, a field plate trench extending into the drift zone and including a field plate, and a planar gate on the first main surface and configured to control current through a channel of the body region; a drain region of the first conductivity type at the second main surface; and a diffusion barrier structure vertically extending in the semiconductor substrate between adjacent field plate trenches, the diffusion barrier structure comprising alternating layers of Si and oxygen-doped Si and a Si capping layer on the alternating layers of Si and oxygen-doped Si.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description which follows.

DETAILED DESCRIPTION

Embodiments described herein provide a quasi-planar power MOSFET device having a diffusion barrier structure in one or more regions of the device. The diffusion barrier structure includes alternating layers of Si and oxygen-doped Si and a Si capping layer on the alternating layers of Si and oxygen-doped Si. The diffusion barrier structure may be used to improve charge carrier mobility in crucial current conduction locations such as the channel, JFET pinch off areas and the drift zone. The diffusion barrier structure may be used to also enable sharper doping profiles such as laterally for the body regions and/or vertically for the substrate tail, to enable high channel density and improve FOMs such as Rdson·Qg and Rdson·Qoss of the power MOSFET where Qg is gate charge and Qoss is output charge. By enabling lowers FOMs, power efficiency can be improved. In addition, enabling a lateral concept offers significant advantages regarding monolithic integration of further functionalities such as the stages of a driver for reducing parasitic switching effects and allowing higher switching frequencies.

The diffusion barrier structure described herein may be interposed between body regions of adjacent transistor cells to better define the body regions, for example. In this location, the diffusion barrier structure restricts lateral outward diffusion of the body implant which helps to prevent a JFET effect from constricting the current between the adjacent body regions in an on-state of the device and therefore improves charge carrier mobility in this region (lower Rdson). The diffusion barrier structure may be included in other parts of the device, such as in the body region of each transistor cell to improve charge carrier mobility in the channels (lower Rdson) and/or between adjacent field plate trenches to improve charge carrier mobility in the drift zones (lower Rdson). If the device has epitaxial layers with different vertical doping profiles between the drain region and the field plate trenches, the diffusion barrier structure may help to shape or delimit the different vertical doping profiles. The diffusion barrier structure may extend along the drain region to provide substrate diffusion tail control for a steeper doping profile at the interface between the drift zones and drain region which lowers Rdson in this region of the device. Described next in more detail are embodiments of semiconductor devices having such a diffusion barrier structure.

Figure 1:
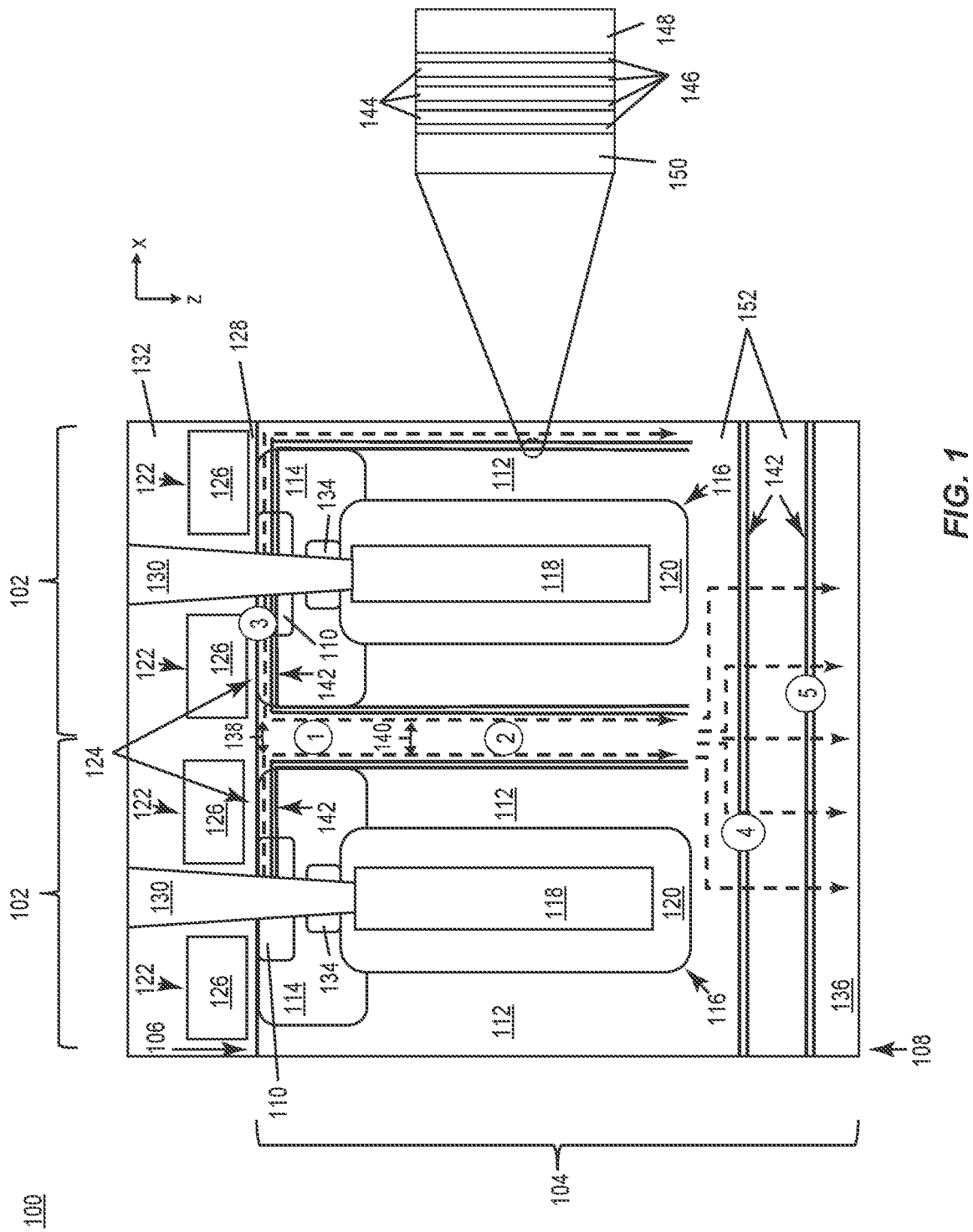
FIG. 1 illustrates a partial cross-sectional view of an embodiment of a quasi-planar power transistor with a diffusion barrier structure.

FIG. 1 illustrates a partial cross-sectional view of an embodiment of a semiconductor device 100 in a region of two neighboring transistor cells 102. The semiconductor device 100 may include 10s, 100s, 1000s or more of the transistor cells 102 electrically coupled in parallel to form a power transistor, where each transistor cell 102 has the same or similar construction.

The semiconductor device 100 may be a power semiconductor device such as a power MOSFET, an IGBT (insulated gate bipolar transistor), etc. The semiconductor device 100 includes a semiconductor substrate 104 having a first main surface 106 and a second main surface 108 opposite the first main surface 106. The semiconductor substrate 104 may comprise any type of semiconductor material such as SiC, Si, GaN, etc. The semiconductor substrate 104 may include a base semiconductor and one or more epitaxial layers grown on the base semiconductor.

Each transistor cell 102 included in the semiconductor device 100 has a source region 110 of a first conductivity type, a drift zone 112 of the first conductivity type, a body region 114 of a second conductivity type separating the source region 110 from the drift zone 112, a field plate trench 116 extending into the drift zone 112 and including a field plate 118 insulated from the drift zone 112 by a field dielectric 120, and a planar gate 122 on the first main surface 106 and configured to control current through a channel 124 of the body region 114. According to the embodiment illustrated in FIG. 1, the source region 110 and body region 114 of each transistor cell 102 are vertically aligned (in the z-direction) with a respective field plate trench 116.

The field plate trenches 116 may be needle-shape or stripe-shaped. The term 'needle-shaped' as used herein means a trench structure that is narrow and long in a depth-wise direction (z direction in FIG. 1) of the semiconductor substrate 104. For example, the field plate trenches 116 may resemble needles, columns or spicules in the depth-wise (z) direction of the semiconductor substrate 104. For stripe-shaped trenches, the lengthwise extension runs into and out of the page in FIG. 1.

The gates 122 of the semiconductor device 100 are 'planar' in that the corresponding gate electrodes 126, which are separated from the underlying semiconductor substate 104 by a gate dielectric 128, are disposed above the first main surface 106 of the substrate 104 instead of in gate trenches etched into the substrate 104. The channels 114 laterally extend along the bottom of the planar gates 122.

Some or all of the field plates 118 may be coupled to a different potential than the gate electrodes 126. For example, the field plates 118 may be grounded. The use of grounded field plates 118 enables a two-dimensional depletion region while shielding the gate dielectric 128 from the drain potential. The field plates 118 are accessible by contacts 130 that extend through an interlayer dielectric 132 and to or into the field plates 118. In the case of the field plates 118 being at source potential, the contacts 130 may extend through the source regions 110 and the body regions 114. Highly doped body contact regions 134 may be formed in the body regions 114 to provide an ohmic connection between the body regions 114 and the field plate contacts 130.

A drain region 136 of the first conductivity type is disposed at the second main surface 108 of the semiconductor substrate 104. Accordingly, the semiconductor device 100 is a quasi-planar device in that the main current flow path from the source regions 110 to the drain region 136 includes a lateral component 138 along the channels 124 and a vertical component 140 through the drift zones 112 to the drain region 136. The main current flow path for the semiconductor device 100 is indicated by dashed lines with arrows in FIG. 1. Depending on the type of device, additional structures may be formed in the drift zones 112 and/or between the drift zones 112 and the drain region 136. For example, a field stop layer (not shown) may be formed between the drift zones 1112 and the drain region 136 in the case of an IGBT type device.

In the case of an n-channel device, the source regions 110, drift zones 112 and drain region 136 are doped n-type and the body regions 114 are doped p-type. Conversely in the case of an p-channel device, the source regions 110, drift zones 112 and drain region 136 are doped p-type and the body regions 114 are doped n-type.

Whether the semiconductor device 100 is an n-channel device or a p-channel device, the device 100 also includes a diffusion barrier structure 142 in one or more regions of the device 100 which are identified with the circles labelled 1 through 5 in FIG. 1. The diffusion barrier structure 142 includes alternating layers of Si 144 and oxygen-doped Si 146 and a Si capping layer 148 on the alternating layers of Si 144 and oxygen-doped Si 146.

The oxygen-doped Si layers 146 have a very high oxygen dopant concentration within respective monolayers 146, each of which adjoins a Si layer 144 which may be of a different thickness than the adjoining oxygen-doped Si layer 146. The alternating layers of Si 144 and oxygen-doped Si form 146 form an oxygen-doped silicon region grown by epitaxy. In an embodiment, the oxygen concentration for each oxygen-doped Si layer 146 is below 5e14 $cm^{-3}$. Each oxygen-doped Si layer 146 may have a thickness in the atomic range (e.g. one or several atoms thick) or in the nanometer (nm) range to ensure sufficient crystal information for growing Si 144 on the oxygen-doped Si layers 146. The alternating layers of Si 144 and oxygen-doped Si 146 may be realized by epitaxially growing Si layers 144 alternating with oxygen layers 146 respectively adsorbed on surfaces of the Si layers 144, e.g., with a particular limited thickness for the oxygen-doped Si layers 146 to ensure adequate Si growth.

FIG. 1 provides an exploded view of the diffusion barrier structure 142, which may also include a Si buffer layer 150 adjacent the alternating layers of Si 144 and oxygen-doped Si 146. The Si buffer layer 150 may be relatively thin, e.g., in the range of 2-5 nm thick. The Si buffer layer 150 may be grown after an implant or an etch step. The capping layer 148, if included in the diffusion barrier structure 142, provides high carrier mobility.

The oxygen-doped Si layers 146 of the diffusion barrier structure 142 may be formed by introducing oxygen partial monolayers to a Si lattice. The oxygen atoms are interstitially placed to minimize disruption to the Si lattice. Layers 144 of Si atoms separate adjacent oxygen partial monolayers 146. The alternating layers of Si 144 and oxygen-doped Si 146 may be formed by Si epitaxy with absorption of oxygen at different steps. For example, temperature and gaseous conditions can be controlled during the epitaxy process to form the partial oxygen monolayers 146. Oxygen may be introduced/incorporated between epitaxial layers of Si 144, e.g. by controlling the introduction of an oxygen precursor into the epitaxy chamber. The resulting barrier barrier structure 142 includes monolayers 146 that comprise mainly Si but have a doped level or concentration level of oxygen alternating with standard epitaxial layers 144 of Si without oxygen. The diffusion barrier structure 142 also comprises a capping layer 148 of Si epitaxially grown on the alternating layers of Si 144 and oxygen-doped Si 146, or the capping layer 148 of Si may be omitted.

As indicated by the region of the semiconductor substrate 104 labeled '1' in FIG. 1, the diffusion barrier structure 142 may be interposed between the body regions 114 of adjacent transistor cells 102. In this case, the oxygen-doped Si layers 146 of the diffusion barrier structure 142 limit lateral out-diffusion of dopant atoms from the drift regions 114 into the adjoining drift zone 112, and are especially effective at limiting interstitial-driven diffusion as the oxygen acts as an interstitial stop. Accordingly, dopant interdiffusion is slowed down by the diffusion barrier structure 142 in a plane perpendicular to the oxygen-doped Si layers 146 of the diffusion barrier structure 142. Such restriction on the lateral outward diffusion of the body implant helps to prevent a JFET effect from constricting the current between the adjacent body regions in an on-state of the device. Accordingly, lower Rdson may be achieved and/or cell pitch may be reduced. For example, a >20% mobility improvement and sharper doping profiles by using the diffusion barrier structure 142 enables >10% to 20% pitch reduction.

As indicated by the region of the semiconductor substrate 104 labeled '2' in FIG. 1, the diffusion barrier structure 142 may vertically extend in the semiconductor substrate 104 between adjacent field plate trenches 116 in a (z) direction toward the drain region 136. In this case, the capping layer 148 of the diffusion barrier structure 142 increases charge carrier mobility in the drift zones 112 which lowers Rdson.

As indicated by the region of the semiconductor substrate 104 labeled '3' in FIG. 1, the diffusion barrier structure 142 may extend into the body region 114 of each transistor cell 102 along the channel 124. The capping layer 148 of the diffusion barrier structure 142 provides high carrier mobility in the channel 124 of the transistor cells 102 which lowers Rdson. The oxygen-doped Si layers 146 of the diffusion barrier structure 142 also may improve carrier mobility within the channel 124 of the transistor cells 102. Part of the channel 124 may be formed in the part of the Si capping layer 148 which laterally extends along the planar gates 122. The buffer layer 150 may be omitted from the diffusion barrier structure 142 in the region labeled '3' in FIG. 1.

The semiconductor substrate 104 may include a plurality of epitaxial layers 152 with different vertical doping profiles between the drain region 136 and the field plate trenches 116, e.g., to adjust the trade-off between breakdown voltage and Rdson/Coss where Coss is output capacitance. As indicated by the region of the semiconductor substrate 104 labeled '4' in FIG. 1, the diffusion barrier structure 142 may be used to help shape or delimit the different vertical doping profiles to allow for sharper doping profiles. That is, the diffusion barrier structure 142 may be formed between each epitaxial layer 152 having a different vertical doping profile to limit the out-diffusion of dopant atoms between the epitaxial layers 152.

As indicated by the region of the semiconductor substrate 104 labeled '5' in FIG. 1, the diffusion barrier structure 142 may extend along the drain region 136. In this case, the diffusion barrier structure 142 limits an out-diffusion tail which otherwise significantly contributes to FOM loss of the device 100.

Figure 2:
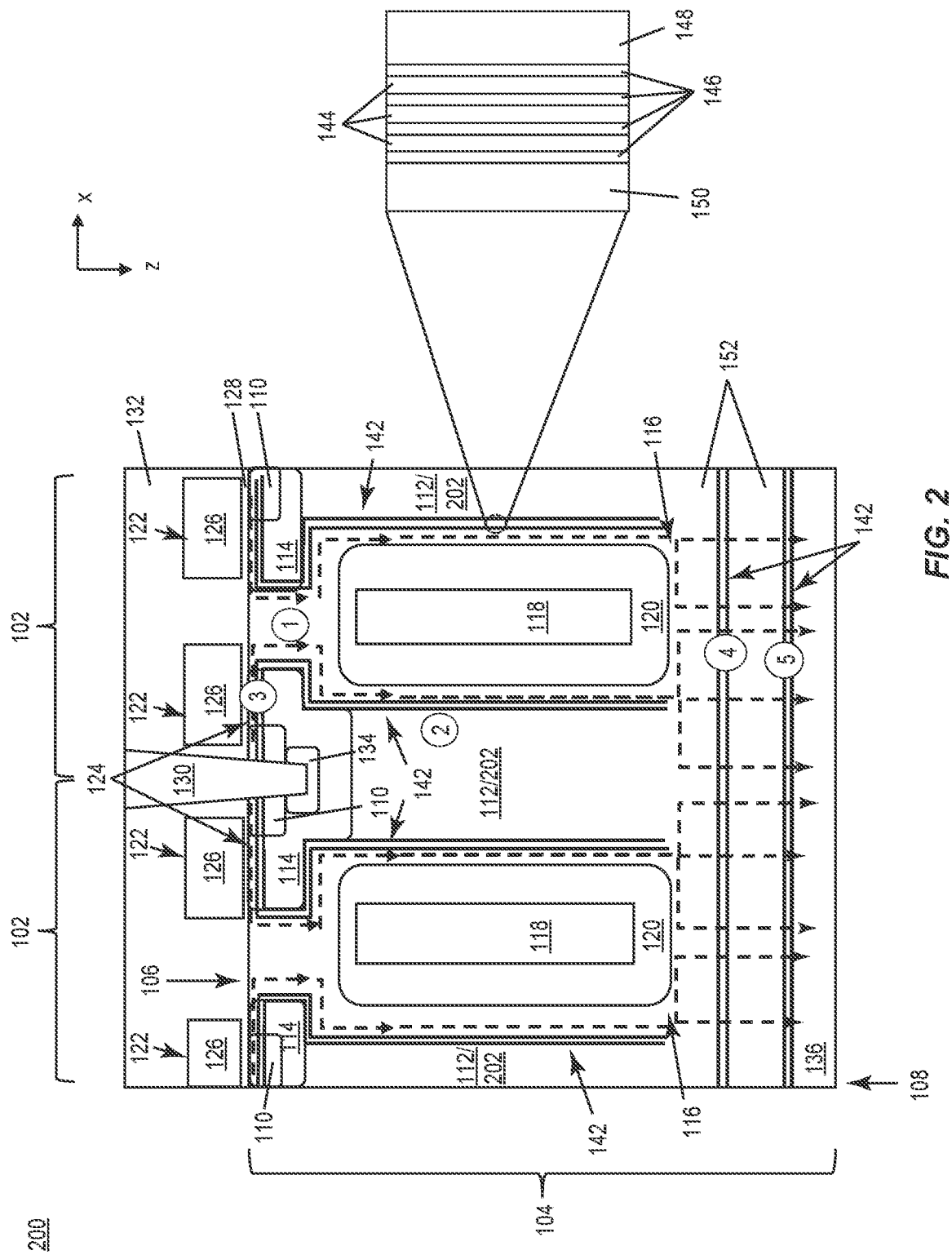
FIG. 2 illustrates a partial cross-sectional view of another embodiment of a quasi-planar power transistor with a diffusion barrier structure.

FIG. 2 illustrates a partial cross-sectional view of another embodiment of a semiconductor device 200 that includes the diffusion barrier structure 142. As explained above in connection with FIG. 1, the diffusion barrier structure 142 may be formed in one or more regions of the device 200 which are identified with the circles labelled 1 through 5. The embodiment illustrated in FIG. 2 is similar to the embodiment illustrated in FIG. 1. Different, however, the source region 110 and the body region 114 of each transistor cell 102 are vertically aligned with a semiconductor mesa 202 delimited by adjacent field plate trenches 116. If the diffusion barrier structure 142 is formed in the region of the semiconductor substrate 104 labelled '3' in FIG. 2, the diffusion barrier structure 142 extends along the channel 124 of each transistor cell 102 and may extend into the corresponding semiconductor mesa 202 delimited by the respective adjacent field plate trenches 116. That is, the diffusion barrier structure 142 may extend from the region of the semiconductor substrate 104 labelled '3' in FIG. 2 to the region labelled '2'.

Figure 3:
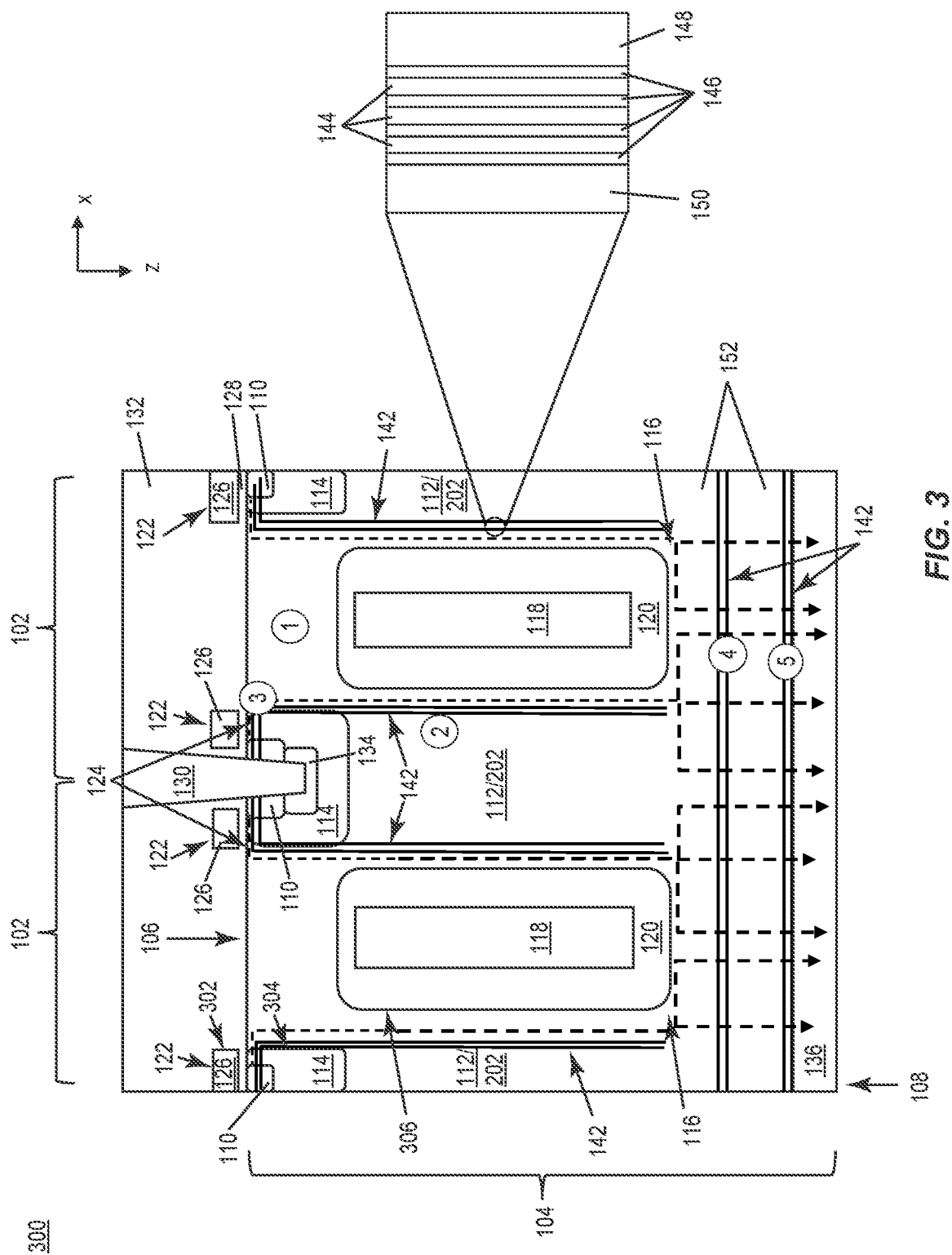
FIG. 3 illustrates a partial cross-sectional view of another embodiment of a quasi-planar power transistor with a diffusion barrier structure.

FIG. 3 illustrates a partial cross-sectional view of another embodiment of a semiconductor device 300 that includes the diffusion barrier structure 142. As explained above in connection with FIG. 1, the diffusion barrier structure 142 may be formed in one or more regions of the device 300 which are identified with the circles labelled 1 through 5. The embodiment illustrated in FIG. 3 is similar to the embodiment illustrated in FIG. 2. Different, however, the lateral extension/side 302 of each gate electrode 126 is aligned with the respective lateral side/end 304 of the corresponding body region 114 in the lateral direction (x-direction in FIG. 3). According to this embodiment, the lateral extension/side 302 of each gate electrode 126 ends close to but does not overlap with the respective lateral side 306 of the corresponding field plate trench 116 in the lateral direction (x-direction in FIG. 3). Accordingly, the main current flow path in the upper part of the transistor cells 102 does not bend or curve around the upper profile of the field plate trenches 116 but instead has a mostly vertical trajectory beginning from the end of the channels 124 and through the semiconductor mesas 202 where the main current flow path traverses along the diffusion barrier structure 142 in the region labelled '2' of FIG. 3.

Although the present disclosure is not so limited, the following numbered examples demonstrate one or more aspects of the disclosure.

Example 1. A semiconductor device, comprising: a semiconductor substrate having a first main surface and a second main surface opposite the first main surface; a plurality of transistor cells, each transistor cell comprising a source region of a first conductivity type, a drift zone of the first conductivity type, a body region of a second conductivity type separating the source region from the drift zone, a field plate trench extending into the drift zone and including a field plate, and a planar gate on the first main surface and configured to control current through a channel of the body region; a drain region of the first conductivity type at the second main surface; and a diffusion barrier structure interposed between body regions of adjacent transistor cells, the diffusion barrier structure comprising alternating layers of Si and oxygen-doped Si and a Si capping layer on the alternating layers of Si and oxygen-doped Si.

Example 2. The semiconductor device of example 1, wherein the diffusion barrier structure extends into the body region of each transistor cell along the channel.

Example 3. The semiconductor device of example 1 or 2, wherein the diffusion barrier structure vertically extends in the semiconductor substrate between adjacent field plate trenches.

Example 4. The semiconductor device of any of examples 1 through 3, wherein the semiconductor substrate includes a plurality of epitaxial layers with different vertical doping profiles between the drain region and the field plate trenches, and wherein the diffusion barrier structure delimits the different vertical doping profiles.

Example 5. The semiconductor device of any of examples 1 through 4, wherein the diffusion barrier structure extends along the drain region.

Example 6. The semiconductor device of any of examples 1 through 5, wherein the source region and the body region of each transistor cell are vertically aligned with a respective field plate trench, and wherein the diffusion barrier structure laterally extends from the source region to the drift zone along the channel of each transistor cell.

Example 7. The semiconductor device of example 6, wherein the diffusion barrier structure vertically extends in the semiconductor substrate between adjacent field plate trenches in a direction toward the drain region.

Example 8. The semiconductor device of any of examples 1 through 5, wherein the source region and the body region of each transistor cell are vertically aligned with a semiconductor mesa delimited by adjacent field plate trenches, and wherein the diffusion barrier structure extends along the channel of each transistor cell and into the semiconductor mesa delimited by the respective adjacent field plate trenches.

Example 9. A semiconductor device, comprising: a semiconductor substrate having a first main surface and a second main surface opposite the first main surface; a plurality of transistor cells, each transistor cell comprising a source region of a first conductivity type, a drift zone of the first conductivity type, a body region of a second conductivity type separating the source region from the drift zone, a field plate trench extending into the drift zone and including a field plate, and a planar gate on the first main surface and configured to control current through a channel of the body region; a drain region of the first conductivity type at the second main surface; and a diffusion barrier structure extending along the channel of each transistor cell, the diffusion barrier structure comprising alternating layers of Si and oxygen-doped Si and a Si capping layer on the alternating layers of Si and oxygen-doped Si.

Example 10. The semiconductor device of example 9, wherein the diffusion barrier structure vertically extends in the semiconductor substrate between adjacent field plate trenches.

Example 11. The semiconductor device of example 9 or 10, wherein the semiconductor substrate includes a plurality of epitaxial layers with different vertical doping profiles between the drain region and the field plate trenches of the transistor cells, and wherein the diffusion barrier structure delimits the different vertical doping profiles.

Example 12. The semiconductor device of any of examples 9 through 11, wherein the diffusion barrier structure extends along the drain region.

Example 13. The semiconductor device of any of examples 9 through 12, wherein the source region and the body region of each transistor cell are vertically aligned with a respective field plate trench, and wherein the diffusion barrier structure laterally extends from the source region to the drift zone along the channel of each transistor cell.

Example 14. The semiconductor device of example 13, wherein the diffusion barrier structure vertically extends in the semiconductor substrate between adjacent field plate trenches in a direction toward the drain region.

Example 15. The semiconductor device of any of examples 9 through 12, wherein the source region and the body region of each transistor cell are vertically aligned with a semiconductor mesa delimited by adjacent field plate trenches, and wherein the diffusion barrier structure extends along the channel of each transistor cell and into the semiconductor mesa delimited by the respective adjacent field plate trenches.

Example 16. A semiconductor device, comprising: a semiconductor substrate having a first main surface and a second main surface opposite the first main surface; a plurality of transistor cells, each transistor cell comprising a source region of a first conductivity type, a drift zone of the first conductivity type, a body region of a second conductivity type separating the source region from the drift zone, a field plate trench extending into the drift zone and including a field plate, and a planar gate on the first main surface and configured to control current through a channel of the body region; a drain region of the first conductivity type at the second main surface; and a diffusion barrier structure vertically extending in the semiconductor substrate between adjacent field plate trenches, the diffusion barrier structure comprising alternating layers of Si and oxygen-doped Si and a Si capping layer on the alternating layers of Si and oxygen-doped Si.

Example 17. The semiconductor device of example 16, wherein the diffusion barrier structure extends into the body region of each transistor cell along the channel.

Example 18. The semiconductor device of example 16 or 17, wherein the semiconductor substrate includes a plurality of epitaxial layers with different vertical doping profiles between the drain region and the field plate trenches of the transistor cells, and wherein the diffusion barrier structure delimits the different vertical doping profiles.

Example 19. The semiconductor device of any of examples 16 through 18, wherein the diffusion barrier structure extends along the drain region.

Example 20. The semiconductor device of any of examples 16 through 19, wherein the source region and the body region of each transistor cell are vertically aligned with a respective field plate trench, and wherein the diffusion barrier structure laterally extends from the source region to the drift zone along the channel of each transistor cell.

Example 21. The semiconductor device of example 20, wherein the diffusion barrier structure vertically extends in the semiconductor substrate between adjacent field plate trenches in a direction toward the drain region.

Example 22. The semiconductor device of any of examples 16 through 19, wherein the source region and the body region of each transistor cell are vertically aligned with a semiconductor mesa delimited by adjacent field plate trenches, and wherein the diffusion barrier structure extends along the channel of each transistor cell and into the semiconductor mesa delimited by the respective adjacent field plate trenches.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a semiconductor substrate having a first main surface and a second main surface opposite the first main surface;
a plurality of transistor cells, each transistor cell comprising a source region of a first conductivity type, a drift zone of the first conductivity type, a body region of a second conductivity type separating the source region from the drift zone, a field plate trench extending into the drift zone and including a field plate, and a planar gate on the first main surface and configured to control current through a channel of the body region;
a drain region of the first conductivity type at the second main surface; and
a diffusion barrier structure interposed between body regions of adjacent transistor cells, the diffusion barrier structure comprising alternating layers of Si and oxygen-doped Si and a Si capping layer on the alternating layers of Si and oxygen-doped Si.

2. The semiconductor device of claim 1, wherein the diffusion barrier structure extends into the body region of each transistor cell along the channel of the body region.

3. The semiconductor device of claim 1, wherein the diffusion barrier structure vertically extends in the semiconductor substrate between adjacent field plate trenches.

4. The semiconductor device of claim 1, wherein the semiconductor substrate includes a plurality of epitaxial layers with different vertical doping profiles between the drain region and the field plate trenches, and wherein the diffusion barrier structure delimits the different vertical doping profiles.

5. The semiconductor device of claim 1, wherein the diffusion barrier structure extends along the drain region.

6. The semiconductor device of claim 1, wherein the source region and the body region of each transistor cell are vertically aligned with a respective field plate trench, and wherein the diffusion barrier structure laterally extends from the source region to the drift zone along the channel of the body region.

7. The semiconductor device of claim 6, wherein the diffusion barrier structure vertically extends in the semiconductor substrate between adjacent field plate trenches in a direction toward the drain region.

8. The semiconductor device of claim 1, wherein the source region and the body region of each transistor cell are vertically aligned with a semiconductor mesa delimited by adjacent field plate trenches, and wherein the diffusion barrier structure extends along the channel of the body region and into the semiconductor mesa delimited by the respective adjacent field plate trenches.

9. A semiconductor device, comprising:
a semiconductor substrate having a first main surface and a second main surface opposite the first main surface;
a plurality of transistor cells, each transistor cell comprising a source region of a first conductivity type, a drift zone of the first conductivity type, a body region of a second conductivity type separating the source region from the drift zone, a field plate trench extending into the drift zone and including a field plate, and a planar gate on the first main surface and configured to control current through a channel of the body region;
a drain region of the first conductivity type at the second main surface; and
a diffusion barrier structure extending along the channel of the body region, the diffusion barrier structure comprising alternating layers of Si and oxygen-doped Si and a Si capping layer on the alternating layers of Si and oxygen-doped Si.

10. The semiconductor device of claim 9, wherein the diffusion barrier structure vertically extends in the semiconductor substrate between adjacent field plate trenches.

11. The semiconductor device of claim 9, wherein the semiconductor substrate includes a plurality of epitaxial layers with different vertical doping profiles between the drain region and the field plate trenches of the transistor cells, and wherein the diffusion barrier structure delimits the different vertical doping profiles.

12. The semiconductor device of claim 9, wherein the diffusion barrier structure extends along the drain region.

13. The semiconductor device of claim 9, wherein the source region and the body region of each transistor cell are vertically aligned with a respective field plate trench, and wherein the diffusion barrier structure laterally extends from the source region to the drift zone along the channel of the body region.

14. The semiconductor device of claim 13, wherein the diffusion barrier structure vertically extends in the semiconductor substrate between adjacent field plate trenches in a direction toward the drain region.

15. The semiconductor device of claim 9, wherein the source region and the body region of each transistor cell are vertically aligned with a semiconductor mesa delimited by adjacent field plate trenches, and wherein the diffusion barrier structure extends along the channel of the body region and into the semiconductor mesa delimited by the respective adjacent field plate trenches.

16. A semiconductor device, comprising:
a semiconductor substrate having a first main surface and a second main surface opposite the first main surface;
a plurality of transistor cells, each transistor cell comprising a source region of a first conductivity type, a drift zone of the first conductivity type, a body region of a second conductivity type separating the source region from the drift zone, a field plate trench extending into the drift zone and including a field plate, and a planar gate on the first main surface and configured to control current through a channel of the body region;
a drain region of the first conductivity type at the second main surface; and
a diffusion barrier structure vertically extending in the semiconductor substrate from the body region of the plurality of transistor cells and into the drift zone between adjacent field plate trenches, the diffusion barrier structure comprising alternating layers of Si and oxygen-doped Si and a Si capping layer on the alternating layers of Si and oxygen-doped Si.

17. The semiconductor device of claim 16, wherein the diffusion barrier structure extends into the body region of each transistor cell along the channel of the body region.

18. The semiconductor device of claim 16, wherein the semiconductor substrate includes a plurality of epitaxial layers with different vertical doping profiles between the drain region and the field plate trenches of the transistor cells, and wherein the diffusion barrier structure delimits the different vertical doping profiles.

19. The semiconductor device of claim 16, wherein the diffusion barrier structure extends along the drain region.

20. The semiconductor device of claim 16, wherein the source region and the body region of each transistor cell are vertically aligned with a respective field plate trench, and wherein the diffusion barrier structure laterally extends from the source region to the drift zone along the channel of the body region.

21. The semiconductor device of claim 20, wherein the diffusion barrier structure vertically extends in the semiconductor substrate between adjacent field plate trenches in a direction toward the drain region.

22. The semiconductor device of claim 16, wherein the source region and the body region of each transistor cell are vertically aligned with a semiconductor mesa delimited by adjacent field plate trenches, and wherein the diffusion barrier structure extends along the channel of the body region and into the semiconductor mesa delimited by the respective adjacent field plate trenches.

* * * * *